(12) United States Patent
Lau et al.

(10) Patent No.: US 6,543,513 B1
(45) Date of Patent: Apr. 8, 2003

(54) WAFER TABLE FOR DIE BONDING APPARATUS

(75) Inventors: Siu Wing Lau, Kwai Chung (HK); Yuk Cheung Au, Kwai Chung (HK)

(73) Assignee: ASM Assembly Automation Ltd. (HK)

(*) Notice: Subject to any disclaimer, the term of this patent is extended or adjusted under 35 U.S.C. 154(b) by 0 days.

(21) Appl. No.: 09/722,053

(22) Filed: Nov. 27, 2000

(51) Int. Cl.[7] ................................................ B65G 49/07
(52) U.S. Cl. ..................... 156/540; 156/584; 269/56; 414/936
(58) Field of Search ............................... 156/378, 538, 156/539, 540, 584; 269/55, 56, 57, 289 R; 414/936, 941

(56) References Cited

U.S. PATENT DOCUMENTS 6,149,047 A  11/2000  Oda

FOREIGN PATENT DOCUMENTS

| JP | 61-210642 | 9/1986 |
| JP | 62-295431 | 12/1987 |
| JP | 01-152634 | 6/1989 |

*Primary Examiner*—Michael W. Ball
*Assistant Examiner*—John T. Haran
(74) *Attorney, Agent, or Firm*—Burns, Doane, Swecker & Mathis, L.L.P.

(57) ABSTRACT

Die bonding apparatus is provided in which in order to move a target die to a pick-up position, a wafer table is moved by rotation and along one linear axis. This reduces the footprint of the apparatus in comparison to prior art apparatus in which this movement is accomplished by movement along two orthogonal linear axes. In an embodiment of the invention, however, movement along a second orthogonal liner axis may also be provided whereby a user may select the method of moving a target die to the pick-up position.

9 Claims, 4 Drawing Sheets

WAFER TABLE FOR DIE BONDING APPARATUS

FIELD OF THE INVENTION

This invention relates to die bonding apparatus, and in particular to such apparatus incorporating a novel wafer table and using a novel means of transferring dies from a wafer table to a bond pad located on a leadframe.

BACKGROUND OF THE INVENTION

In a die bonding apparatus a wafer table is provided for carrying a silicon wafer. The wafer is generally circular and is made up of a large number of integrated circuit devices known as dies which are arranged in a rectangular array. In a die bonding apparatus the dies are picked up from the wafer table by a pick and place device which transfers the dies one by one from the wafer to respective bond pads formed on a leadframe. The bond pad is provided with glue and the dies are pressed onto the bond pad to be located there. This process is shown schematically in FIG. 1 in which a die 1 is shown being transferred from a wafer 2 to leadframe 3 that is provided with a plurality of bond pads 4 each provided with glue 5.

Conventionally the dies are picked up from the wafer by the pick and place device at a fixed location, and the wafer is supported on a movable wafer table that allows the wafer to be positioned so that a die to be picked up by the pick and place device can be moved to the pick-up position from which the pick and place device is adapted to pick up the dies. As is shown in FIG. 2, the wafer table is adapted to move the wafer in mutually orthogonal X and Y directions, and for maximum speed the wafer table is adapted to move in both the X and Y directions simultaneously. In this way any die on the wafer can be moved easily to the pick-up position. Such conventional designs have proved perfectly acceptable in the past, but they have disadvantages with the larger size wafers that are becoming more common in the field.

Wafers are conventionally circular, and in the past conventional wafer sizes have been 6 inches and 8 inches in diameter. A 6 inch diameter wafer means that for any die on the wafer to be movable to the pick-up position, the wafer table must have a range of travel of approximately 6 inches in both the X and Y directions, while for an 8 inch diameter wafer the range of travel increases to 8 inches in both X and Y directions (in fact it is actually a little larger as space has to be allowed for other components such as the wafer expander). To provide sufficient space for this movement a wafer table for an 8 inch wafer must have an available space of about 600×600 mm$^2$.

More recently larger wafer sizes are becoming available. Larger wafer sizes are preferable because they reduce the proportion of dies located at the edge of a wafer to the total number of dies on a wafer. Such edge dies are more likely to be faulty and so larger wafers will have a greater proportion of correctly functioning dies. Wafers of 12 inch diameter are now being produced.

Unfortunately such large wafers present serious difficulties with a conventional wafer table design that is adapted to position the dies at the pick-up position by movement along the XY axes. Such a wafer table would have to have a range of movement of the order of 12 inches in both the X and Y directions, and would require a total area available for movement of some 800×800 mm$^2$ which unacceptably increases the total size and footprint of the die bonding apparatus.

SUMMARY OF THE INVENTION

According to the present invention there is provided die bonding apparatus comprising, a wafer table for supporting a wafer consisting of a plurality of dies, pick-up means for picking a die from a pick-up position and for transporting the die to a bonding location, and means for moving the wafer table whereby a selected die can be moved to the pick-up position, wherein said means for moving the wafer table comprises means for rotating the table and means for moving the table along one axis.

This method of moving a target die to the pick-up position minimises the amount of linear movement of the wafer table that is required and thus minimises the size and in particular the footprint of the apparatus. This is particularly advantageous with relatively large size wafers, but could equally be used with smaller wafer sizes.

The above described method will move a die to the pick-up position, and then at the pick-up position further fine adjustment of the position of the die may be necessary before it can be picked up. Therefore means may be provided for fine adjustment of the position of a die after it has been moved to the pick-up position. Such fine adjustment means may include a vision system.

While the basic movement of a target die to the pick-up position may be effected by rotary movement and by movement along one axis, it may be preferable to provide at least a small amount of movement along another axis normal to the first to facilitate this fine adjustment and therefore the fine adjustment means comprises means for moving along the one axis and along an axis at right angles to the first axis.

In a second embodiment of the invention, in addition to providing movement of the wafer table along a first axis and in a rotary sense, it may also be preferable to provide means for moving the wafer table along a second axis at right angles to said one axis. In such an embodiment a user may be able, at least for smaller size wafers, to choose between rotary movement and movement along one axis, or rectilinear movement along two axes, as the means for moving target dies to the pick-up position.

Using rotary movement to move a target die to the pick-up position may result in dies being in various orientations when they reach the pick-up position. Preferably therefore vision means is provided for sensing the orientation of a die to be picked-up relative to the first axis, and means are further provided for orienting the die to a desired orientation prior to being bonded. A further possibility is that, especially for dies with a high aspect ratio and which require multiple ejector pins, means may be provided for rotating the ejector pin assembly in accordance with the orientation of a die at the pick-up position.

Viewed from another broad aspect the present invention provides die bonding apparatus comprising, a wafer table for supporting a wafer consisting of a plurality of dies, pick-up means for picking a die from a pick-up position and for transporting the die to a bonding location, and means for moving the wafer table whereby a selected die can be moved to the pick-up position, said moving means being adapted to rotate said wafer table and to move said wafer table along two orthogonal axes, wherein said wafer table comprises interchangeable holding means for holding different sizes of wafers, and wherein said wafer table may be moved to move a die to the pick-up position either by rotation and movement along one of said axes or by movement along said two orthogonal axes at the choice of a user.

Such an embodiment provides a user with maximum flexibility as a single machine may be able to work on different size wafers but with the size minimising advantage of the present invention in respect of large wafers. For smaller wafers, users may be able to select their own choice of drive means for the wafer table.

Die bonding apparatus comprising, a wafer table for supporting a wafer consisting of a plurality of dies, pick-up means for picking a die from a pick-up position and for transporting the die to a bonding location, and means for moving the wafer table whereby a selected die can be moved to the pick-up position, said moving means being adapted to rotate said wafer table and to move said wafer table along two orthogonal axes, wherein said wafer table may be moved to move a die to the pick-up position either by rotation and movement along one of said axes or by movement along said two orthogonal axes at the choice of a user.

Viewed from another broad aspect the present invention provides a method of moving a target die in a wafer to a pick-up position in a die bonding process comprising the steps of rotating the wafer until the target die lies on a chosen axis, and linear movement of said wafer along said axis until said target die is at the pick-up poisition.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
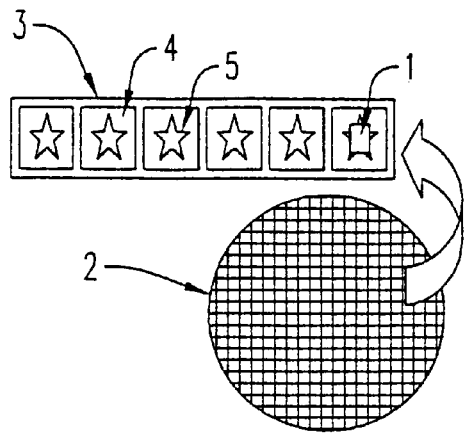
FIG. 1 schematically illustrates the die bonding process.
Figure 2:
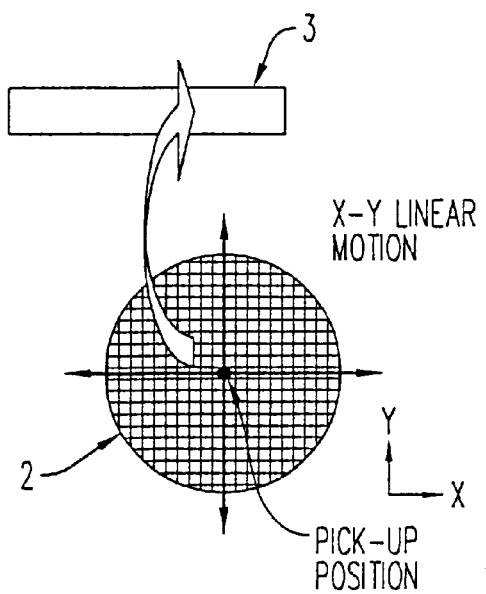
FIG. 2 schematically illustrates a conventional die bonding process including an XY table moving in X and Y directions, FIG. 3 schematically illustrates a die bonding method and apparatus according to an embodiment of the present invention, FIG. 4 schematically illustrates the transfer of dies from the wafer table to the leadframe in an embodiment of the present invention, FIG. 5 schematically shows the use of ejector pins to remove a die from the wafer.
Figure 3:
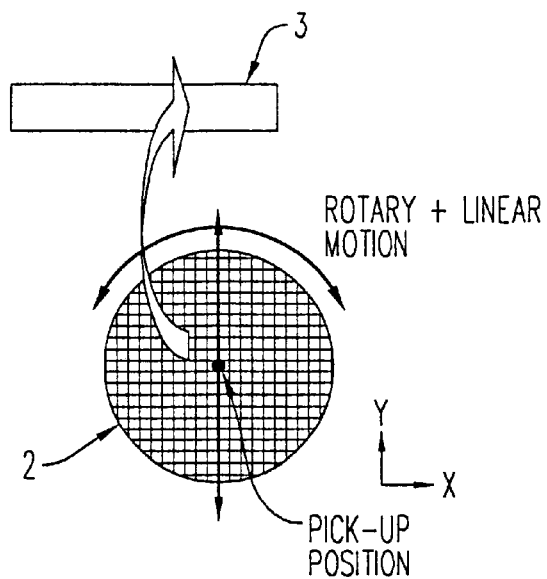

FIG. 3 schematically illustrates the basic idea behind the present invention. In particular, rather than moving the wafer table along the X and Y axes in order to locate a die at the pick-up position, instead the wafer table is adapted to move along one longitudinal axis (the Y axis say) and to rotate about the centre of the wafer table. Such a wafer table may be described as a Yθ wafer table. The table will be able to rotate for at least ±180 degrees (ie in both directions) about the centre of the wafer 2 at which point is located the pick-up position. In addition the table is adapted to move in the Y direction by half the diameter of the wafer 2. As will be explained below, this is sufficient to enable any die on the wafer 2 to be brought to the pick-up position and such an arrangement means that the space requirement for the die bonding apparatus is reduced.

In use of the preferred embodiment of the invention, when it is desired to bring a die to the pick-up position, the wafer table is firstly rotated about the θ axis until the die is located on the Y axis and then the wafer table is moved along the Y axis until the die is at the pick-up position, which as explained above corresponds to the centre of the wafer. It should be noted here, however, that while for simplicity of explanation this description may refer to rotation about θ followed by movement along the Y axis, in practice this rotation and movement may take place at the same time in order to save time.

The Yθ movement is sufficient to being the dies to the pick-up position. However, fine adjustment of the position of the dies is normally required before they can be picked up by the pick-up device. This fine adjustment is made following an examination of the precise position and orientation of the die by a vision system. The vision system is capable of detecting the precise orientation of the die and provides that information to control means which may then calculate what further adjustment of the position of the die is necessary. Such vision systems are known in the art of XY table die bonding apparatus and so will not be described here in detail. The fine adjustment of the die position may be made by further Yθ movement, but it may be preferable to provide a degree of movement in the X direction such that the fine adjustment may be carried out by XY movement.

Figure 4:
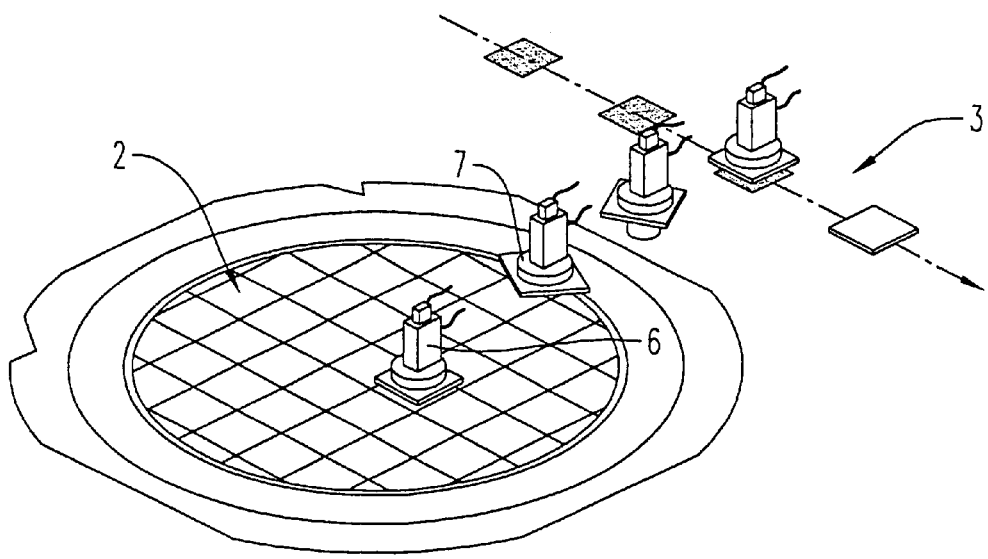

Another issue, which is illustrated with reference to FIG. 4, is that because the dies are rotated to bring them onto the Y axis, rather than being moved along the X axis as in the conventional designs, the angular position of the dies relative to the Y axis and the pick-up position may be changed. This may require re-orientation of the position of the die before it can be bonded to the bond pad on the leadframe. This is preferably done by providing the pick-up device 6 with a rotary collet assembly 7 that allows the die to be rotated after it has been picked up and while it is being transported to the bond pad. This sequence is shown in FIG. 4 in which it will be seen that after a die is picked up from the pick-up position it is rotated by the rotary collet assembly until it is in the correct orientation for bonding to the bond pad. Such rotary collet pick-up devices are also known in the art and will not be described in detail here.

Figure 5:
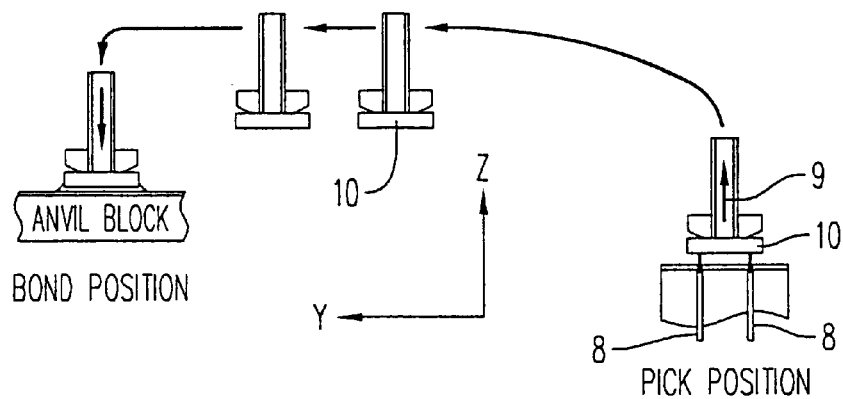

At the pick-up position the dies are freed from the wafer by one or more ejector pins 8 that push upwardly from beneath the wafer table. The pick-up device is then provided with suction means 9 to lift the die from the wafer. Sometimes more than one ejector pin is required, and in the case of relatively elongate dies with a high aspect ratio, these one or more pins (in whatever position they are arranged) must be disposed beneath the die prior to it being picked from the wafer. If the die may reach the pick-up position in a number of different orientations, then this may present difficulties if the ejector pins are not in the correct position beneath the die. To deal with this potential problem, the ejector system may be able to rotate so that when plural ejector pins are provided they may be rotated so as to be in their correct position beneath an elongate die. Information on the orientation of the die at the pick-up location may be transmitted from the vision system to the ejector pin assembly to control the rotary movement of the ejector pin assembly. FIG. 5 shows the basic sequence in which two ejector pins 8 are used to push a die 10 upwardly from the plane of the wafer. The pick-up device is provided with a suction channel 9 so that the die is held to the pick-up device by suction while it is being carried to the bond position where it is bonded to the bond pad by downward pressure against an anvil.

Figure 6:
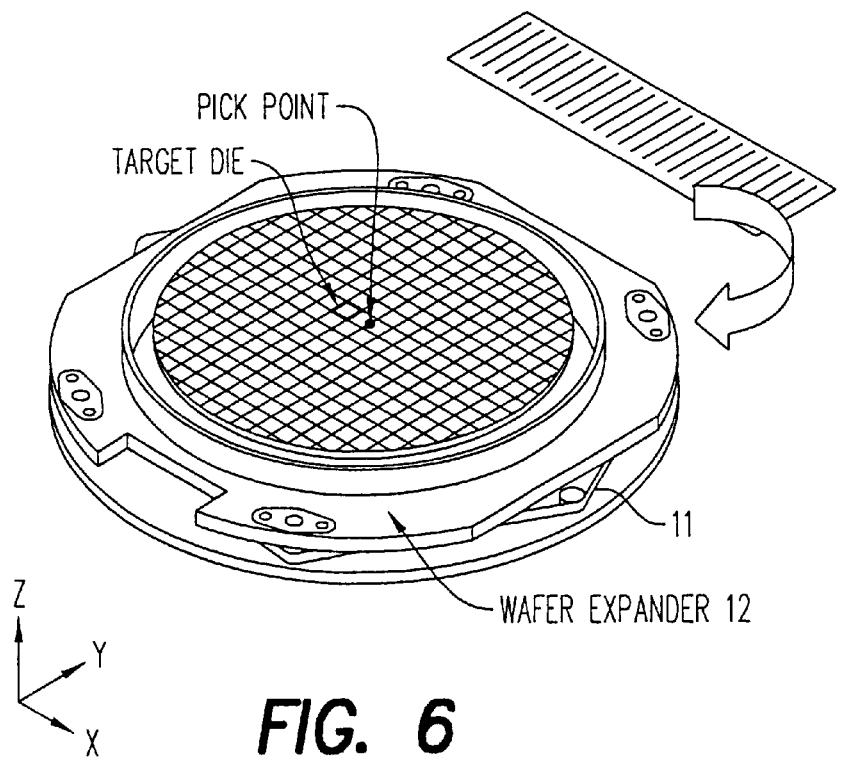
FIG. 6 is a perspective view of a wafer table in an embodiment of the present invention.

FIG. 6 shows an exemplary wafer 2 supported on a wafer table. The wafer table is driven in rotation by a belt drive 11 though any other suitable form of rotary driving mechanism may be used. The Y movement is provided by a sliding table not shown in this Figure but which will be shown and described in FIG. 7 in reference to a further embodiment of the invention. As is known the wafer table includes a wafer expander 12 surrounding the wafer and which serves to expand the wafer so as to separate individual dies from each other in order that dies can be removed from the wafer one by one.

A major advantage of the present invention over the prior art is the reduction in the space required for movement of the wafer table. Movement in the Y direction is only required for up to one half of the diameter of the wafer, ie 6 inches for a 12 inch wafer, because all other movement is achieved by the rotation of the wafer table. For a 12 inch wafer the total footprint would be approximately 400×550 mm$^2$, which is only about 60% of the area that a conventional XY table would require for movement with a 12 inch wafer.

While the invention in the embodiment described above is a wafer table having rotary movement in the θ direction and movement in the Y direction with the wafer table being fixed in the X direction, other than providing a very small amount of movement in the X direction to facilitate the fine adjustment of the dies at the pick-up position, in another form of the invention the wafer table may also be provided with means for moving in the X direction additionally if desired. This has the advantage of providing die bonding apparatus with a wafer table capable of both Yθ and XY movement. Such an apparatus would be preferable because the Yθ movement can be used for large (e.g. 12 inch) diameter wafers to keep the overall size of the apparatus to a minimum, while the apparatus can also be used with smaller wafers (e.g. 6 inch or 8 inch diameters wafers) in either a Yθ or XY mode in accordance with a users preference.

Figure 7:
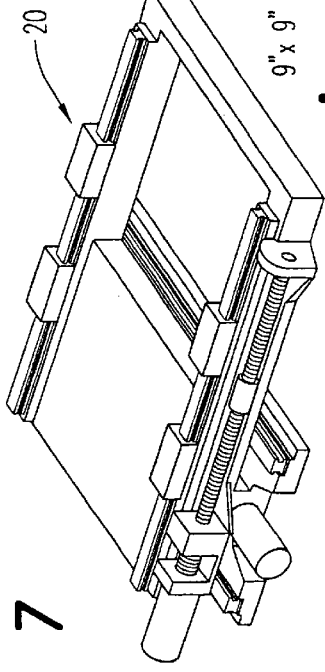
FIG. 7 illustrates a second embodiment of the invention and illustrates the use of the invention with different sizes of wafers.
Figure 7B:
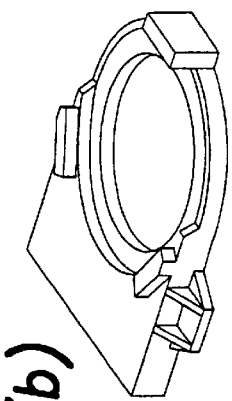
Figure 7E:
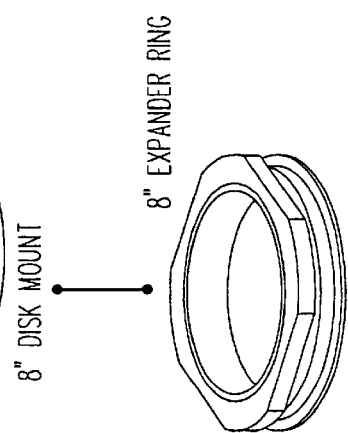
Figure 7A:
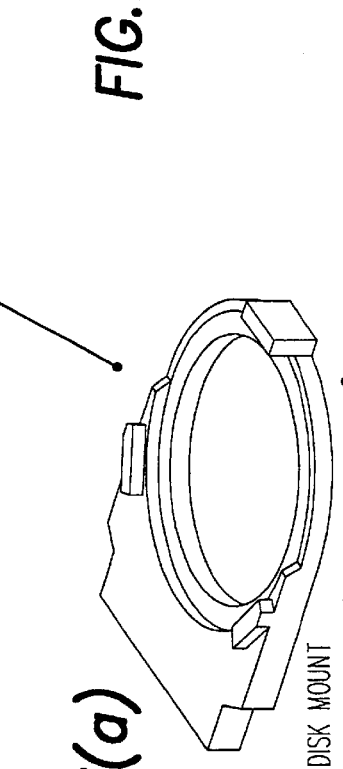
Figure 7D:
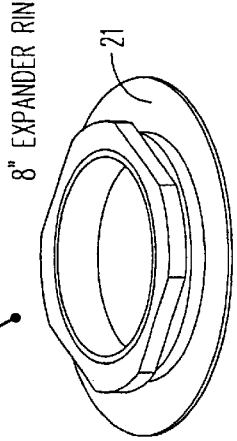
Figure 7C:
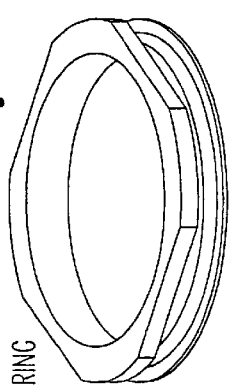

The basic structure of such an apparatus is shown in FIG. 7. The apparatus is formed with a 9"×9" XY table 20 capable for movement in the XY directions sufficient to handle a 8 inch wafer in a conventional XY mode. To the top of the XY table 20 may be fixed a mounting device adapted to hold an expander ring for different sizes of wafers and a rotary drive in the manner of FIG. 6. FIG. 7(*a*) shows a 12 inch mount and FIG. 7(*b*) an 8 inch mount, each being capable of receiving a 12 inch (FIG. 7(*c*)) or 8 inch (FIGS. 7(*d*) & (*e*)) expander ring respectively. Indeed, by means of a suitable adaptor 21, the 12 inch mount may also be capable of receiving a 8 inch expander ring.

Thus in this embodiment the present invention provides die bonding apparatus capable of handling a range of wafer sizes, including large wafer sizes, while minimising the total size of the apparatus by using a Yθ movement system for the largest wafers. Smaller and mid-size wafers can be moved using Yθ or XY movement in accordance with a user's preference.

What is claimed is:

1. Die bonding apparatus comprising
    a wafer table for supporting a wafer, said wafer consisting of a plurality of dies,
    pick-up means for picking a die from a pick-up position and for transporting the die to a bonding location, and
    means for moving the wafer table comprising means for rotating the table and means for moving the table along one axis such that any selected die in said wafer is moved to said pick-up position solely by means of movement of said table along said one axis in combination with rotation of said table.

2. Die bonding apparatus as claimed in claim 1 wherein means are provided for fine adjustment of the position of a die after it has been moved to the pick-up position.

3. Die bonding apparatus as claimed in claim 2 wherein said fine adjustment means comprises means for moving along said one axis and along an axis at right angles to said one axis.

4. Die bonding apparatus as claimed in claim 1 wherein said apparatus comprises vision means for sensing the orientation of a die to be picked-up relative to said one axis, and means for orienting said die relative to said one axis in a desired orientation prior to being bonded.

5. Die bonding apparatus as claimed in claim 1 wherein said wafer table moving means includes rotary driving means for rotating said table.

6. Die bonding apparatus as claimed in claim 1 including an ejector pin assembly and means for rotating the ejector pin assembly in accordance with the orientation of a die at the pick-up position.

7. Die bonding apparatus comprising,
    a wafer table for supporting a wafer, said wafer consisting of a plurality of dies,
    pick-up means for picking a die from a pick-up position and for transporting the die to a bonding location, and
    means for moving the wafer table whereby a selected die can be moved to the pick-up position, said moving means being adapted to rotate said wafer table and to move said wafer table along two orthogonal axes, wherein said wafer table may be selectively moved in either of two alternative modes of operation to position a die at the pick-up position, wherein a first mode consists of rotation and movement solely along one of said axes, and a second mode comprises movement along said two orthogonal axes.

8. The die bonding apparatus of claim 1, wherein said table moves a maximum distance of about one-half the diameter of said wafer along said one axis to locate any selected die at said pick-up position.

9. The die bonding apparatus of claim 7, wherein said table moves along said one axis during said first mode of operation a maximum distance of about one-half the diameter of said wafer to locate any selected die at said pick-up position.

* * * * *